US012581908B2

(12) United States Patent
Plach

(10) Patent No.: US 12,581,908 B2
(45) Date of Patent: Mar. 17, 2026

(54) SUBSTRATE HOLDER AND METHOD FOR FIXING AND BONDING A SUBSTRATE

(71) Applicant: EV Group E. Thallner GmbH, St. Florian am Inn (AT)

(72) Inventor: Thomas Plach, St. Florian am Inn (AT)

(73) Assignee: EV GROUP E. THALLNER GMBH, St. Florian am Inn (AT)

( * ) Notice: Subject to any disclaimer, the term of this patent is extended or adjusted under 35 U.S.C. 154(b) by 533 days.

(21) Appl. No.: 17/922,505

(22) PCT Filed: Jun. 29, 2020

(86) PCT No.: PCT/EP2020/068223
§ 371 (c)(1),
(2) Date: Oct. 31, 2022

(87) PCT Pub. No.: WO2022/002345
PCT Pub. Date: Jan. 6, 2022

(65) Prior Publication Data
US 2023/0187259 A1     Jun. 15, 2023

(51) Int. Cl.
*H01L 21/687*         (2006.01)
(52) U.S. Cl.
CPC .............................. *H01L 21/68728* (2013.01)
(58) Field of Classification Search
CPC ......... H01L 21/68728; H01L 21/68735; H01L 21/6838; H01L 21/67092
See application file for complete search history.

(56) References Cited

U.S. PATENT DOCUMENTS

| | | | |
|---|---|---|---|
| 10,438,918 B2 | 10/2019 | Omori et al. | |
| 10,991,609 B2 | 4/2021 | Zinner et al. | |
| 2003/0001103 A1* | 1/2003 | Kobayashi | H01L 21/6835 269/21 |
| 2008/0224364 A1* | 9/2008 | Funk | H01L 21/6838 264/571 |
| 2008/0229811 A1* | 9/2008 | Zhao | F16C 32/0603 73/104 |
| 2014/0209230 A1 | 7/2014 | Wagenleitner | |
| 2019/0019678 A1 | 1/2019 | Wagenleitner et al. | |
| 2019/0096848 A1 | 3/2019 | Huang et al. | |
| 2020/0027768 A1* | 1/2020 | Zinner | H01L 21/68 |
| 2022/0336259 A1* | 10/2022 | Lee | H01L 21/68742 |

FOREIGN PATENT DOCUMENTS

| | | |
|---|---|---|
| CN | 107851591 A | 3/2018 |
| EP | 2656378 B1 | 3/2015 |
| JP | H07-308856 A | 11/1995 |
| JP | H11150176 A | 6/1999 |

(Continued)

OTHER PUBLICATIONS

International Search Report from corresponding International Patent Application No. PCT/EP20/68223, dated Mar. 1, 2021.

(Continued)

*Primary Examiner* — Seahee Hong
(74) *Attorney, Agent, or Firm* — RENNER, OTTO, BOISSELLE & SKLAR, LLP

(57)         ABSTRACT

A substrate holder for mounting a substrate, comprising fixing elements for fixing the substrate, wherein the fixing elements can be grouped into zones, and a corresponding method.

18 Claims, 4 Drawing Sheets

(56)    References Cited

FOREIGN PATENT DOCUMENTS

| JP | 2014-502784 | A | 2/2014 |
|----|-------------|---|--------|
| JP | 2014-529885 | A | 11/2014 |
| JP | 201826414 | A | 2/2018 |
| JP | 2019-514197 | A | 5/2019 |
| JP | 2019-533897 | A | 11/2019 |
| TW | 201308495 | A | 2/2013 |
| TW | 201526151 | A | 7/2015 |
| TW | 201802883 | A | 1/2018 |
| TW | 201826425 | A | 7/2018 |
| WO | WO2012083978 | A1 | 6/2012 |
| WO | WO2013023708 | A1 | 2/2013 |
| WO | WO2014191033 | A1 | 12/2014 |
| WO | WO2017162272 | A1 | 9/2017 |
| WO | WO2018028801 | A1 | 2/2018 |
| WO | WO2018/166605 | A1 | 9/2018 |
| WO | WO2019/057286 | A1 | 3/2019 |

OTHER PUBLICATIONS

Office Action (with English translation) mailed May 2, 2024 from related/corresponding Taiwan Patent Appl. No. 110120713.
Office Action (with English translation) dated Feb. 7, 2024 in related/corresponding Japanese Patent Application No. 2022-572805.
First Office Action and Search Report issued in Chinese Patent Application No. 202080101439.7 dated Mar. 26, 2025.
Notification of Reasons for Refusal issued in related Japanese Patent Application No. 2024-112044 dated Apr. 17, 2025.

* cited by examiner

SUBSTRATE HOLDER AND METHOD FOR FIXING AND BONDING A SUBSTRATE

FIELD OF INVENTION

The present invention relates to a substrate holder and a method for fixing and bonding a substrate.

BACKGROUND OF INVENTION

There are publications in the prior art in which it is disclosed how substrates can be joined with one another in the optimum manner. In particular, publication WO2017162272A1 shows a substrate holder, which comprises individual zones. In addition, publications WO2013023708A1, WO2012083978A1, WO2018028801A1 should be mentioned.

Asymmetrically formed substrates represent a very great problem in the prior art. Many substrates have a mechanical anisotropy, i.e. their E-modulus is markedly direction-dependent. As a result of the direction dependency of the E-modulus, other mechanical properties, in particular expansions, are also direction-dependent. If a force, in particular the force of gravity, acts on these substrates, an asymmetrical deformation results. This asymmetrical deformation is still present during the contact between the two substrates and/or during the bonding process and necessarily leads to an asymmetrical propagation of the bonding wave front and thus to an undesired run-out effect.

Substrates have been joined together by so-called bonding processes for a number of years in the semiconductor industry. Before the joining, these substrates must be aligned with one another as accurately as possible, wherein divergences in the nanometre range nowadays play a part. The alignment of the substrates usually takes place by means of alignment marks. Apart from the alignment marks, other, in particular functional, elements are also present on the substrates, which also have to be aligned with one another during the bonding process. This alignment accuracy between the individual functional elements is required for the entire substrate surface. Thus, for example, it is not sufficient for the alignment accuracy to be very good in the centre of the substrates, but to diminish towards the edge.

In the prior art, there are, as already mentioned earlier, a number of methods and systems, with the aid of which an attempt can be made to exert an influence on the bonding process, such as for example publications WO2017162272A1, EP2656378B1 or WO2014191033A1.

One of the greatest challenges in bonding is the period of time in which the two substrates are joined with one another independently. That is the period of time from the bond initiation up to the complete contacting of the contact faces of the substrates. The alignment of the two substrates with respect to one another can still change decisively here compared to the previous alignment. Once the two substrate surfaces are first joined together, a separation is theoretically again possible, but is associated with high costs, low throughput and susceptibility to errors.

SUMMARY OF INVENTION

The present invention provides a device and a method for bonding two substrates, with which the problems of the prior art are eliminated and in particular the bonding accuracy, in particular at the edge of the substrates, is increased.

The present problem is solved with the features of the coordinated claims. Advantageous developments of the invention are given in the sub-claims. All combinations of at least two features given in the description, in the claims and/or the drawings also fall within the scope of the invention. In stated value ranges, values lying inside the stated limits are also deemed to be disclosed as limiting values and can be claimed in any combination.

The invention relates to a substrate holder for mounting a substrate, comprising fixing elements for fixing the substrate, wherein the fixing elements can be grouped into zones, wherein the zones are preferably arranged ring-shaped, still more preferably circular ring-shaped.

A zone is an arbitrary number of fixing elements, irrespective of whether the fixing elements are located spatially adjacent or on opposite edge regions. Since a zone represents a number of fixing elements, the definition or the establishment of a zone can also change with time.

In the following text of the publication, reference will be made to the shape or the position of the zone. This means the shape and the positions of the envelope surrounding all the fixing elements inside one such zone. When mention is made of the switching capability of a zone, this means the switching capability of all the fixing elements inside the zone. In particular, the switching-off of a zone means the switching-off of all the fixing elements inside the zone. Unaffected by this, preferably all fixing elements inside a zone can also be switched individually. In the extreme case, a zone contains only one fixing element.

All the fixing elements of the same zone can preferably be triggered by a single control element, in particular a control valve with the use of vacuum fixing elements. It is thus advantageously possible to switch all the fixing elements of a zone simultaneously.

The various fixing elements or zones can in particular be switched offset in time, in order to advantageously deform the advancing bonding wave in a targeted manner.

Furthermore, the invention relates to a method for the fixing and bonding of a substrate or a plurality of substrates, in particular with a substrate holder according to the invention, wherein the fixing elements are grouped into zones, wherein the zones are preferably constituted ring-shaped, still more preferably circular ring-shaped.

By means of the ring-shaped arrangement, the substrate can advantageously be fixed and released in the optimum manner during the bonding process, so that the "run-out" error in particular can be minimised and the bonding accuracy thus significantly increased. With a preferred circular ring-shaped arrangement, the fixing and release is possible in a still more favourable manner, since the bonding wave usually also propagates in a circular ring shape.

A substrate holder is preferably provided, wherein the zones are arranged symmetrically relative to the centre of the substrate holder. Since the bonding wave usually propagates symmetrically relative to the centre of the substrate holder, a further improvement of the bonding accuracy is thus advantageously achieved.

Furthermore, a substrate holder is preferably provided, wherein the zones are arranged in a plurality of rings, preferably circular rings, around the centre of the substrate holder. An optimum release can thus advantageously take place also in the radial direction of the substrate holder.

Furthermore, a substrate holder is preferably provided, wherein the zones are uniformly spaced apart from one another in the radial direction and/or in the azimuthal direction. A particularly exact control of the release can thus advantageously take place.

Furthermore, a substrate holder is preferably provided, wherein the zones are formed with a changing width, in particular with an increasing, width from the centre of the substrate holder to the edge of the substrate holder. This changing width may be necessary in order to achieve a better bonding result, since the speed at which a bonding wave propagates can also change as a function of the distance from the centre.

Furthermore, a substrate holder is preferably provided, wherein the zones can be switched individually. A flexible control of these zones according to the desired release is thus advantageously made possible.

Furthermore, a substrate holder is preferably provided, wherein a plurality of zones can be grouped and switched in common. A larger area can thus advantageously be switched as required, so that the release can take place more flexibly and more exactly.

Furthermore, a substrate holder is preferably provided, wherein the number of fixing elements in the zones can be changed flexibly. Thus, for example, the force of attraction in the individual zones can be increased or reduced, so that an exact control of the release is advantageously made possible.

Furthermore, a substrate holder is preferably provided, wherein the fixing elements can be flexibly assigned to different zones. In addition, it is alternatively or additionally possible for the fixing elements to be triggered in a cross-zonal manner. The retention force in the zones can thus advantageously be adjusted flexibly as required.

The invention describes in particular a device and a method for producing a bond between two substrates with minimum run-out. The invention is based in particular on the idea of using at least one substrate holder which comprises specially formed zones, comprising a plurality of fixing elements, for fixing an in particular asymmetrically deformed substrate. By means of the specially formed zones and their fixing elements, in particular also by means of an inventive switching of these zones or their fixing elements, the asymmetrical deformation of the substrates, in particular while the bonding process is still taking place, is compensated for in such a way that an optimum bonding wave front and therefore an optimum Bond results.

It is generally not known which substrates are next fixed on a substrate holder, what mechanical anisotropy they have and how greatly they are distorted during the fixing. Furthermore, substrates which are of different thicknesses are generally also deformed to a differing extent due to gravity when they are fixed on an upper substrate holder. It is not therefore possible to produce a new substrate holder for each type of asymmetry occurring.

By means of the substrate holder according to the invention, the asymmetrically deformed substrates in particular are advantageously compensated for by means of targeting switching techniques of the zones, in such a way that the asymmetries can be compensated for, in particular while the bonding process is still taking place. Advantageously, only one kind of substrate holder thus has to be designed and the latter can be used for different substrates with asymmetrical deformations of differing degrees.

The invention is based on the idea of providing a substrate holder with specially formed zones, the shape, arrangement and triggering of which improves the bonding result. As already described in detail in publication WO2017162272A1, the adjustment of the curvature of a substrate is of decisive importance for a successful, fault-free bonding process. The present invention thus primarily describes very special substrate holders, the development of which has been completed in the past few months and years.

In particular, reference is also made to the already published process steps from WO2017162272A1.

The substrate holder according to the invention is used chiefly as an upper substrate holder, but can certainly also be used at the underside of a bonding installation for the fixing of lower substrates. In particular, a substrate holder according to the invention can in each case be used as an upper substrate holder and a substrate holder according to the invention can be used as a lower substrate holder. The targeted adjustment of the curvature, which has been dealt with and disclosed in detail in WO2017162272A1, is further improved by the design of the new substrate holder according to the invention.

A change in curvature is understood in particular to mean a state diverging from the initial state (in particular the curvature adjusted before the contacting) of the substrates. According to the invention, after contact is made between the contact surfaces, the bonding is controlled in particular by controlled guidance of the fixing of the substrates. Corresponding fixing means are provided in particular according to the device.

A further, in particular independent, aspect of the present invention includes the use of fixing elements, which can in particular be switched individually and which are grouped into specially formed zones, and with the aid of which an advancing bonding wave between the contact surfaces can be controlled or regulated in a managed fashion. The form of the disclosed zones is so special that an important distinguishing feature with regard to WO2017162272A1 results.

A zone generally comprises at least one fixing element, in particular a plurality of fixing elements, which can be controlled individually.

The notion primarily underlying the idea is to control, guide or regulate the advancing bonding wave by means of targeted control, guidance or regulation of the curvature and/or fixing and/or release of at least one of the two substrates, in such a way that an optimum, sequential contacting of the two substrates along the contact surfaces, in particular advancing from the inside outwards, takes place. By means of this method according to the invention, asymmetries of the substrate, in particular mechanical ones, which are present before and/or during the bonding, are intended to be compensated for in such a way that the bonding wave has a desired, in particular radially symmetric form. According to the invention, this effect is achieved by specially formed zones and an inventive triggering of the fixing elements of the zones. Optimum contacting is understood in particular to mean that the "run-out" fault is a minimal or in the optimum case even disappears at every point of the contact interface between the two substrates.

Generally, the substrate holder according to the invention permits the advance of the bonding wave to be influenced in a direction-dependent manner. In particular, a bonding wave front can be produced with the substrate holder according to the invention, which propagates in a radially symmetrical manner, i.e. in a circular manner. The substrate held by the substrate holder according to the invention can thus be anisotropically deformed in a targeted manner by the triggering of the individual specially formed zones.

Irrespective of whether the substrate holder according to the invention is used at the upper side or at the lower side, a different influence arises on the substrates fixed by them. The greatest difference between the two substrates is the direction of the effect of gravity during the bonding process. In the case of the upper fixed substrate, gravity brings about a generally anisotropic sag after the activation and/or deactivation of at least some zones. This is not the case with the lower substrate.

Sensors

Sensors for monitoring the distance between the substrate and substrate holder are preferably incorporated in the substrate holder according to the invention. With the aid of the sensors, the propagation speed and the, in particular symmetrical, form of the bonding wave can be monitored during the bonding process and, if necessary, can be adaptively regulated. If this extension according to the invention is incorporated in both substrate holders, both substrates can thus be measured simultaneously and, in particular while the bonding process is still taking place, can be adapted such that their run-out error is minimised. The adaptation takes place in particular by the targeted switching of the various, specially formed zones.

Fixing Elements

All the fixing elements mentioned according to the invention can be switched individually, i.e. into the fixing or non-fixing state. In particular, the pressing force of the substrate on the fixing elements can also be adjusted in a targeted manner, so that the normal force or normal stress can be determined.

The fixing elements can be separated from one another by sealing elements. In a particularly preferred embodiment according to the invention, the fixing elements are however set back, in particular milled, relative to the substrate holder surface. This embodiment is especially well suited when use is made of vacuum fixing elements. In an extension according to the invention, small elevations, pins or webs are located in the depression, the surface whereof is congruent with the substrate holder surface.

The individual fixing elements inside a zone (for example circular segments on the same radius) are flexibly controllable, so that for example it is possible to fix the substrate during the loading process almost along the entire circumference. At this time, the substrate is thus as flat as possible. For the bonding process itself, it is then possible to deactivate a plurality of fixing elements along the same radius.

It is also possible to switch off the fixing property of the fixing elements of a zone either simultaneously, or also with a defined delay, which enables a finer control of the bonding speed. Especially when a non-radially symmetric advance of the bonding wave front is being measured, the individual fixing elements can be switched in such a way that the bonding wave front again becomes radially symmetric.

If the fixing elements are designed as a vacuum fixing elements, a pressure between 0.01 mbar and 1000 mbar, preferably between 0.01 mbar and 800 mbar, still more preferably between 0.01 mbar and 500 mbar, most preferably between 0.01 mbar and 100 mbar, with utmost preference between 0.01 mbar and 10 mbar is present in the vacuum fixings. The differential pressure between the greater, outer pressure and the smaller, inner pressure in the vacuum fixing elements is then the contact pressure on the substrate, which leads to the fixing of the substrate.

Zones

The individual fixing elements can be grouped into zones.

In a first embodiment according to the invention, a plurality of zones are located exclusively at the periphery of the substrate holder. The zones are separated from one another radially and/or azimuthally. In particular, a radial and an azimuthal separation is present.

The zones are preferably arranged symmetrically about a rotational axis with n-fold symmetry. The value of n is greater than 1, preferably greater than 4, still more preferably greater than 6, most preferably greater than 12, with utmost preference greater than 24. The greater the stepsize of the rotational axis, the more zones are present along a circular circumference, but the smaller the zones along its azimuthal angle. The optimum number of zones per circular circumference, and the optimum number of zones along the radial directions, are determined in particular by empirical measurements and/or by simulations.

In a first embodiment according to the invention, a plurality of zones, in particular comprising a plurality of fixing elements, are located at the periphery of the substrate holder and a large zone, which in particular comprises only one single fixing element, in the centre. This central zone occupies the major part of the substrate surface and is used for a strong fixing of a substrate. The zones at the periphery of the substrate holder are used for the finer control, in particular the targeted influencing of the form of the bonding wave.

In a second embodiment according to the invention, the substrate holder is comprised exclusively of zones, in particular provided at the periphery, which are comprised of a plurality of fixing elements. The largest part of the substrate holder in terms of area has no zones.

In a third embodiment according to the invention, the substrate holder is comprised exclusively of the zones provided at the periphery, comprising a plurality of fixing elements, as well as an in particular completely circumferential, closed single zone, comprised of at least, preferably precisely, one fixing element.

In a fourth embodiment according to the invention, the substrate is fixed at the outer edge by a completely circumferential, in particular closed, most preferably circular zone, comprising at least one fixing element. Zones which are located inside the outer zone can be switched in such a way that they deform the substrate. This is possible in particular when the fixing function of the individual fixing elements is based on vacuum suction or a fluid flushing option.

In a fifth embodiment according to the invention, at least some of the zones are formed such that they surround or at least skirt the other zones.

The zones and/or the fixing elements can in particular be arranged in the following configurations:

1. Ring shape
2. Spirals
3. Grid form
4. Radial rays
5. Combinations of the aforementioned (in particular, rings which are connected by radial rays)

Loading Pins

If the substrate holder comprises loading pins, holes are necessarily located in the substrate holder surface. If the zones are switched by means of vacuum fixings, measures may have to be taken by the purpose of sealing. Due to the holes in which these loading pins move, there are a plurality of variants for the application of the overpressure in the zones:

In a first variant, the holes simply remain open (with optimisation of the embodiment for small amounts of leakage) and the overpressure must be maintained by a corresponding continuous flow of a fluid in the region between the substrate and the substrate holder (equilibrium between inflow and outflow).

In a second variant, the loading pins are provided with a seal, which makes it possible to build up a static overpressure in the occluded region between the wafer and the holding device.

If the substrate holder according to the invention is constituted as an upper substrate holder, the loading pins can be pins which comprise a hole, a tube or another fluid system in their interior, with which a vacuum is generated at the loading pin surface, so that a substrate to be loaded against the direction of gravity can be fixed and raised. These loading pins thus pull the fixed substrate upwards during the loading process, until it makes contact with the substrate holder surface and is finally fixed by the latter.

Cutouts

The substrate holder according to the invention comprises in particular passages or cutouts, which can in particular be glazed, in order to be able to view the rear side of the fixed substrates. The passages can preferably be closed with lids, in particular automatically.

Deformation Element

A further, in particular independent idea, or one which can be combined with the aforementioned invention, comprises the use of a deformation element as a curvature means and/or means of changing the curvature, which is formed in particular by a gas outlet opening. A mechanical contact with the substrate is thus prevented. The control of the curvature takes place still more precisely by a combination of the aforementioned features.

All the described embodiments according to the invention can comprise deformation elements, which deform the fixed substrate. In particular, each individual zone, insofar as it comprises vacuum fixing elements, can use fluids for the deformation of the substrates.

If the deformation element is working with a fluid, the pressure of the fluid lies between 0.1 bar and 10 bar, preferably between 0.2 bar and 8 bar, still more preferably between 0.3 bar and 7 bar, most preferably between 0.4 bar and 6 bar, with utmost preference between 0.5 bar and 5 bar.

The force with which the deformation element is applied on a substrate lies between 0.1N and 1000N, preferably between 0.2N and 500N, still more preferably between 0.3N and 250N, most preferably between 0.4N and 200N, with utmost preference between 0.5N and 100N.

Monitoring of the Bonding Wave

In order to determine the propagation speed of the bonding wave front in a direction-dependent manner, sensors can be integrated into the substrate holder, which make it possible to measure the distance between the substrate holder surface and the loaded substrate at any arbitrary time:

1. A plurality of sensors along the radius in order to determine the speed as a function of the distance from the centre, in particular along the radii which run through the centres of the individual zones.

2. A plurality of sensors along the radii, which lie between the radii which are mentioned in point 1. The determination of the speeds in different directions is thus possible.

By means of the existing sensors, which can determine the distance between a substrate and the substrate holder surface, it is possible to monitor the propagation of the bonding wave. Each sensor has a certain starting value before the start of the bonding process. The starting value is zero for example when the substrate in the region of the sensor is in contact with the substrate holder surface. The starting value has a value greater than zero if the substrate is not fixed over the whole area and for example is sagging locally or is curved locally. Each sensor receives in particular a final value after completion of the bonding process. When the value of the sensor now correspondingly changes, it can be concluded from this whether the substrates have been bonded or not in the region of the given sensor. A course of the bonding wave position as a function of time thus results. Depending on the precise arrangement of the sensors, it is also possible to acquire data of the bonding wave position as a function of time in different directions.

Method

Bonding Measurement Method

A preferred, first method according to the invention, with the aid of which the bonding wave front of two substrates to be bonded can be measured and adapted, proceeds as follows.

In a first process step, a first substrate is fixed on a first substrate holder, in particular one according to the invention.

In a second process step, a second substrate is fixed on a second substrate holder, in particular one according to the invention.

In a third process step, the values of the sensors, which measure the substrate rear sides of the first and/or the second substrate, are determined and/or set to zero. In particular, the sensors are distance sensors.

In a fourth process step according to the invention, the two substrates are advanced towards one another until such time as a desired distance is present between the substrate surfaces which are to be bonded together.

In a fifth process step according to the invention, the upper and/or the lower substrate are deformed with the aid of a deformation element already mentioned, so that contact is made between the two substrates at a least one, in particular precisely one, point. In particular, the measurement of the substrate surface rear sides with the aid of the sensors already takes place during the deformation of the upper and/or lower substrate, so that the curvatures of the upper and/or lower substrate are already known extremely precisely before and/or during the contacting. A possible asymmetry occurring in the deflection can thus already be detected.

In a sixth process step according to the invention, a release of the first and/or second substrate, brought about by the individual switching of the fixing elements of the individual zones, in particular controlled in a targeted manner, takes place precisely in such a way that the bonding wave front is developed as desired in terms of time. In particular, the bonding wave front between the two substrates should assume a radially symmetrical form at all times. During the propagation of the bonding wave front, the sensors continuously measure the substrate surface rear sides of the first and/or second substrate, so that, in the event of an undesired deviation of the bonding wave front, the bonding wave front can be brought back into its desired form by targeted triggering of the individual fixing elements of the zones.

An alternative, second preferred method according to the invention performs the fourth and the fifth process step of the first method according to the invention in reverse order. The first and/or the second substrate are first deformed without making contact with one another. A relative approach of the two substrates towards one another then takes place until contact is made. In particular, the relative approach of the two substrates by means of the relative translatory movement of the two substrate holders ends as soon as contact is made.

In a special embodiment of the method according to the invention, the lower substrate is always fixed over the full area, i.e. not curved.

Apart from the method according to the invention for the bonding wave measurement, there are also the methods according to the invention for the bonding wave manipulation. The latter can be combined in particular with the aforementioned methods for the bonding wave measurement, in particular in process step 6. These methods according to the invention are very special and primarily dependent on the substrate holders with special zones according to the invention. They are described in detail here.

The first method according to the invention for the bonding wave manipulation also contains in particular the following process steps:

First Bonding Process

In a first process step according to the invention, the lower substrate is fixed over the full area, i.e. not curved.

In a second process step according to the invention, the upper substrate is fixed to the substrate holder with a plurality of zones, in particular present exclusively at the periphery of the substrate holder. There are preferably so many zones that a 2*n-fold symmetry can be produced. Particularly preferably, the substrate holders each have eight peripheral zones.

Four zones are then located for example at 0°, 90°, 180° and 270°, subsequently referred to as the normal position. The remaining four, in particular longer zones are located between the latter, i.e. at 45°, 135°, 2250 and 315°, subsequently referred to as the diagonal position. To start with, all 2n zones are in the switching state and fix the upper substrate, so that the latter is firmly fixed and the effect of the sag due to gravity is at least minimised.

In a third process step according to the invention, n of the 2*n zones are deactivated. In particular, the longer zones at the diagonal positions are deactivated. As a result of the deactivation of the n-zones, the substrate is preferably deformed in such a way that an asymmetry due to the mechanical anisotropy and gravity is compensated for, such that the bonding wave acquires the desired form, in particular radially symmetrical, during the bonding process.

In a forth process step according to the invention, the contacting of the substrates takes place, in particular with the aid of a deformation means and/or by relative approach of the substrate holders towards one another.

In a fifth process step according to the invention, a measurement of the substrate holder rear sides of the first and/or second substrate takes place and, if necessary, a corresponding adaptation of the propagating bonding wave front by appropriate switching of the fixing elements of the individual zones.

Second Bonding Method

The second method according to the invention for the bonding wave manipulation also contains in particular the following process steps:

In a first process step according to the invention, the lower substrate is fixed to the substrate holder with a plurality of zones, present in particular exclusively at the periphery of the substrate holder. There are preferably so many zones that a 2*n-fold symmetry can be produced. Particularly preferably, the substrate holders each have eight peripheral zones. Four zones are then located for example at 0°, 90°, 180° and 270°, subsequently referred to as the normal position. The remaining four, in particular longer zones are located between the latter, i.e. at 45°, 135°, 225° and 315°, subsequently referred to as the diagonal position. To start with, all 2n zones are in the switching state and fix the lower substrate.

In a second process step according to the invention, the upper substrate is fixed to the substrate holder with a plurality of zones, in particular present exclusively at the periphery of the substrate holder. There are preferably so many zones that a 2*n-fold symmetry can be produced.

Particularly preferably, the substrate holders each have eight peripheral zones. Four zones are then located for example at 0°, 90°, 180° and 270°, subsequently referred to as the normal position. The remaining four, in particular longer zones are located between the latter, i.e. at 45°, 135°, 225° and 315°, subsequently referred to as the diagonal position. To start with, all 2n zones are in the switching state and fix the upper substrate, so that the latter is firmly fixed and the effect of the sag due to gravity is at least minimised.

In a third process step according to the invention, the zones at the diagonal positions are deactivated.

In a forth process step according to the invention, the contacting of the substrates takes place, in particular with the aid of a deformation means and/or by relative approach of the substrate holders towards one another.

In a fifth process step according to the invention, a measurement of the substrate holder rear sides of the first and/or second substrate takes place and, if necessary, a corresponding adaptation of the propagating bonding wave front by appropriate switching of the fixing elements of the individual zones.

The distance between the substrates having approached one another lies between 0 μm and 2000 μm, preferably between 0 μm and 1500 μm, still more preferably between 0 μm and 1000μ, with utmost preference between 0 μm and 500 μm.

Further advantages, features and details of the invention emerge from the following description of preferred examples of embodiment and with the aid of the drawings.

BRIEF DESCRIPTION OF DRAWINGS

Identical components or components with the same function are denoted by the same reference numbers in the figures.

DETAILED DESCRIPTION OF INVENTION

All the represented figures are diagrammatic representations of the substrate surfaces with their zones and fixing elements, which are not necessarily true to scale. The complete representation of the substrate holders with all the components is intentionally dispensed with, since they have no additional value for the idea according to the invention. In particular, the first three substrate holders according to the invention are represented more precisely than the last three substrate holders.

Figures 1, 2:
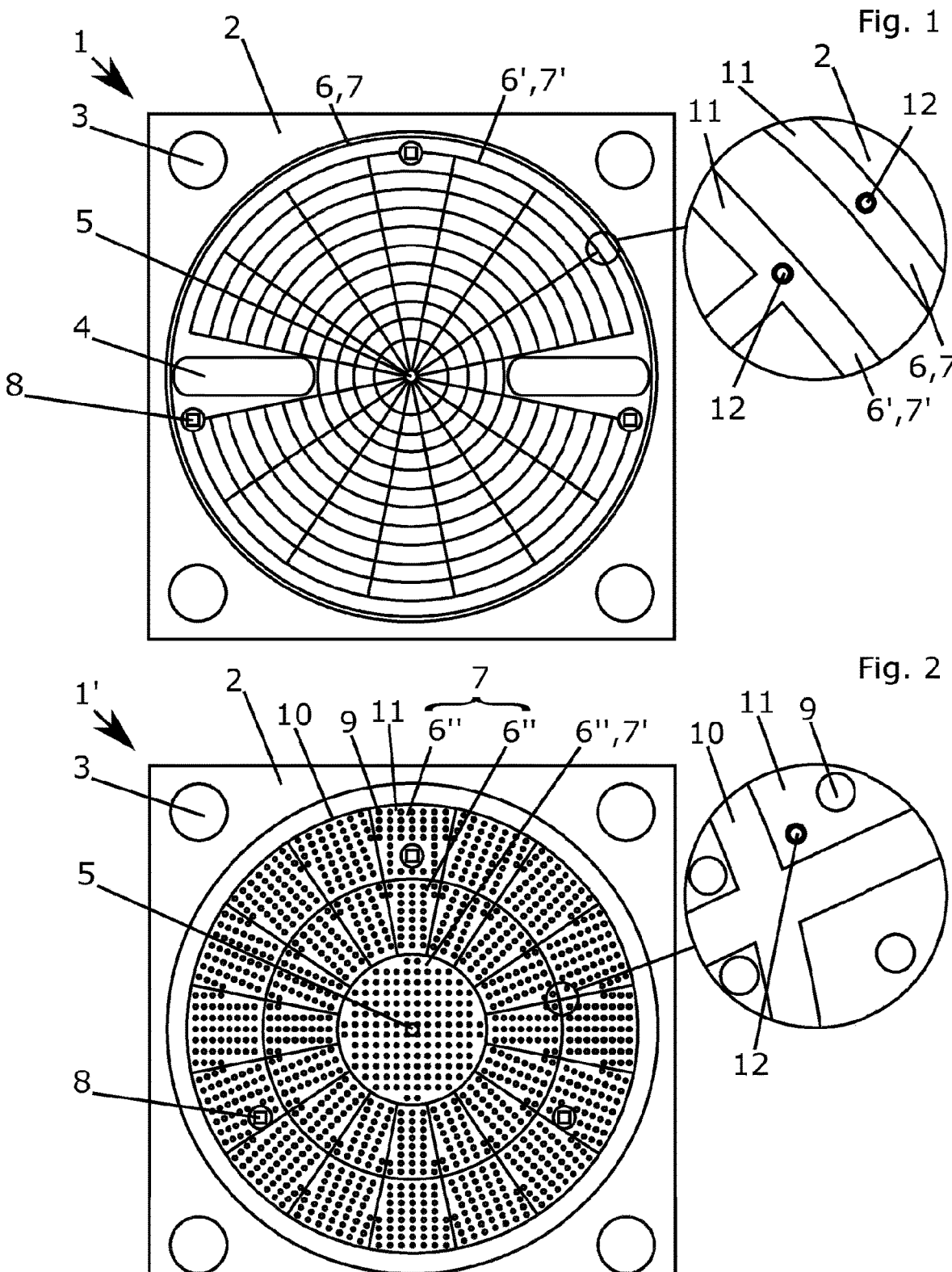
FIG. 1 shows a substrate holder according to the invention in a first embodiment according to the invention.
FIG. 2 shows a substrate holder according to the invention in a second embodiment according to the invention.

FIG. 1 shows the fixing surface of a substrate holder 1 according to the invention in a first illustrative embodiment according to the invention. Substrate holder 1 comprises a base body 2, in particular a plate. Base body 2 can be mounted with fastenings 3 on a device. Located in base body 2, in the fixing region, there are two cutouts 4, in particular elongated holes, through which the rear side of a substrate (not shown) can be observed.

Located in the centre of substrate holder 1 is a deformation element 5, in particular a pin or a nozzle. The substrate holder comprises two, in particular differently constituted fixing elements 6, 6' according to the invention. Outer fixing element 6 is designed in particular around the entire circumference and circular. Fixing elements 6, 6' are in particular depressions 11 constituted very thin, which can preferably be evacuated via a fluid opening 12 and thus act as vacuum fixing elements.

Inner fixing element 6' is designed as a network of depressions 11 over the remaining area of base body 2. Fixing element 6' is in particular also designed as a vacuum fixing element. Outer fixing elements 6 is therefore the sole fixing element belonging to a zone 7. Inner fixing element 6' is the sole fixing element belonging to a zone 7'. Substrate holder 1 can also comprise various sensors 8, in particular pressure measuring sensors.

Zones 7,7' are arranged ring-shaped, in particular circular ring-shaped, in all the represented embodiments.

The number of pins 9 represented in the following figures is much fewer in the figures than in an actual substrate holder. A substrate holder according to the invention can have hundreds, if not even thousands of such pins 9 per fixing element 6''.

FIG. 2 shows the fixing surface of a substrate holder 1' according to the invention in a second embodiment according to the invention. Base body 2 can be mounted with fastenings 3 on a device. Substrate holder 1' comprises a plurality of fixing elements 6'', in particular delimited radially and azimuthally.

Fixing elements 6'' are in particular set back, preferably countersunk depressions 11, in which pins 9 are located at several points. The pin surface of pins 9 is in particular congruent with the web surface of webs 10.

Fixing elements 6'' are constituted in particular as vacuum fixing elements. Depressions 11 can be evacuated via a fluid outlet 12, in particular individually and independently of one another by means of the separation by webs 10. If fixing elements 6'' also serve as deformation elements, a fluid can also flow in via fluid opening 12, which leads to an, in particular local, deformation of a fixed substrate.

A plurality of fixing elements 6'' are grouped together to form a zone 7, whilst a further, differently formed, concentric fixing element 6'' forms a second concentric zone 7'. Preferably located in the centre of substrate holder 1' is a deformation element 5, which can deform a fixed substrate, in particular concentrically. Pins 9 serve in particular to reduce the contact area of a fixed substrate, preferably to prevent contamination. A plurality of sensors 8, in particular pressure sensors, can be distributed over the fixing area of substrate holder 1'.

Figure 3:
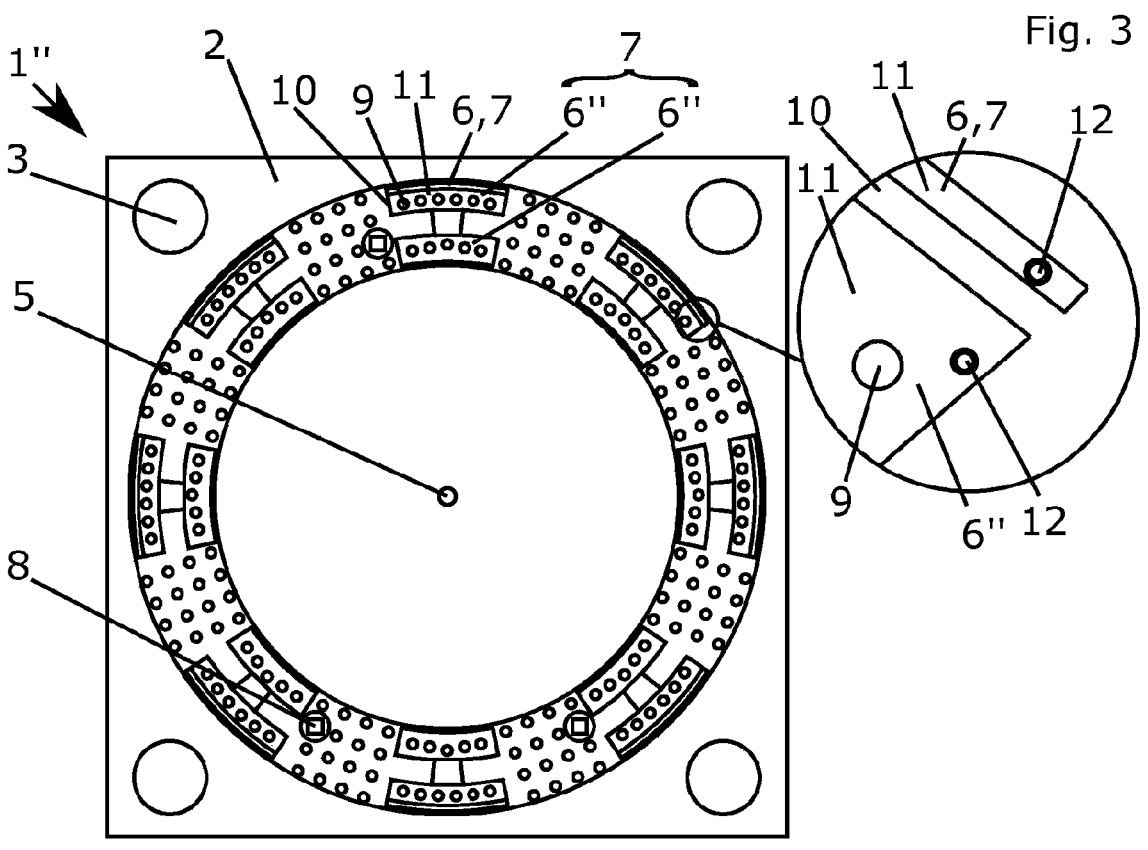
FIG. 3 shows a substrate holder according to the invention in a third embodiment according to the invention.

FIG. 3 shows a further, more advantageous embodiment according to the invention of a substrate holder 1'' according to the invention. Fixing elements 6, 6'' are located at the periphery of substrate holder 1'' and are azimuthally separated from one another. Fixing element 6 is in particular a simple depression 11, a groove, which again has been formed very thin, whereas fixing elements 6 have again been designed as depressions 11, with pins 9 and fluid outlets 12. Areas with depressions 11 with pins 9 can be located between fixing elements 6, 6''. These areas can also, but do not have to be, designed as fixing elements. The centric area can likewise be designed either exclusively as a depression 11 with pins 9 and/or again serve as a fixing element. It would also be conceivable for the centric area to have a flat surface, as represented in the figure. This representation has been selected in this case to place the focus on fixing elements 6, 6'' at the periphery and to highlight them better. Substrate holder 1'' can again comprise sensors 8 and/or a deformation element 5. In particular, individual fixing elements 6, 6'' can also again serve as a fixing and/or deformation element.

All the shown embodiments according to the invention are intended to disclose the concept of a plurality of fixing elements 6, 6', 6'', which can be grouped to form zones 7, 7'. The concept of zone formation, however, goes far beyond the grouping of individual fixing elements which are adjacent to one another. According to the invention, it is in fact possible to group into zones fixing elements which are not adjacent to one another. To illustrate this aspect according to the invention, the illustration of the substrate holders with all the details will be refrained from in the following figures. On the contrary, the fixing elements will only be referred to with the aid of reference numbers 6, 6', 6'' and the zones with the aid of reference numbers 7, 7', 7'', 7'''.

The represented zones separated from one another azimuthally have a circle segment angle between 5° and 90°, preferably between 10° and 70°, still more preferably between 20° and 50°, most preferably between 22° and 30°, with utmost preference of approximately 22.5°.

The zones have a radial length between 50 mm and 1 mm, preferably between 50 mm and 10 mm, still more preferably between 50 mm and 20 mm, most preferably between 50 mm and 30 mm, with utmost preference between 50 mm and 40 mm.

Figure 4:
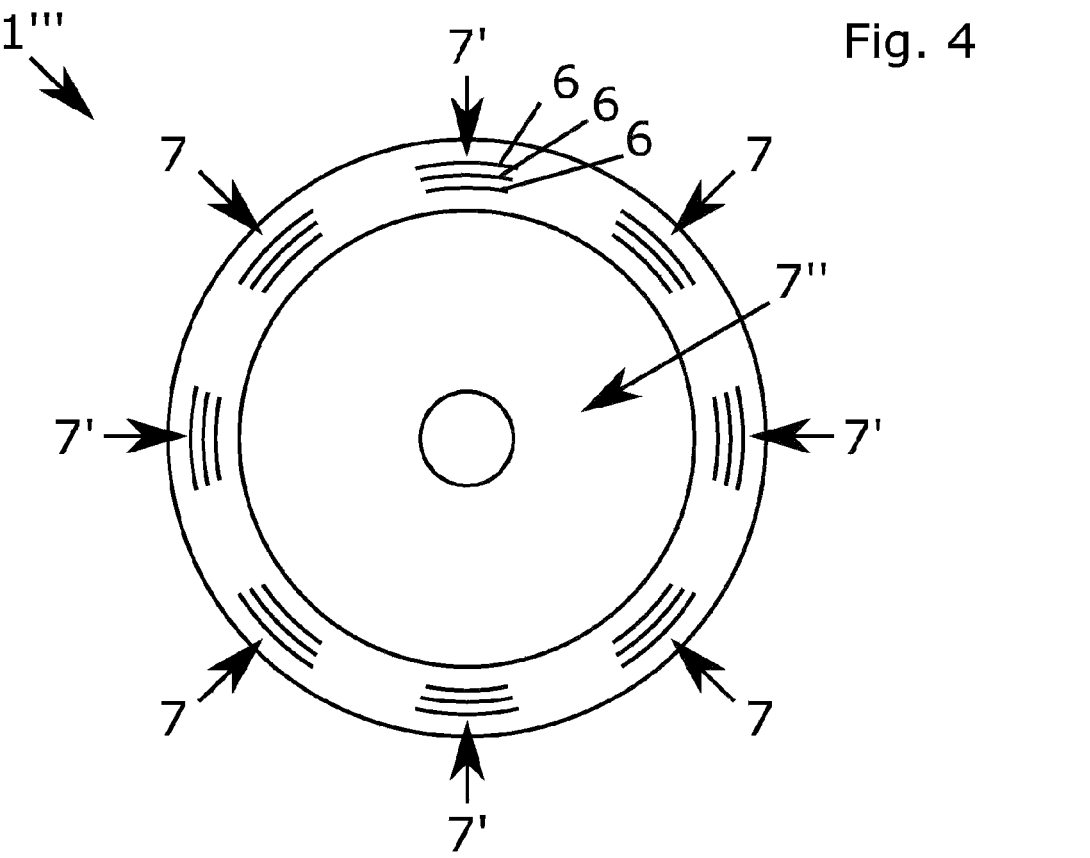
FIG. 4 shows a substrate holder according to the invention represented in a simplified form in a fourth embodiment according to the invention.

FIG. 4 shows a further, special embodiment of a substrate holder according to the invention, wherein there are three different zones. First zone 7 is comprised of a total of 12 fixing elements 6, which are located in groups each with three fixing elements 6 in the diagonal. Second zone 7' is comprised of a total of 12 fixing elements, which are located in groups each with three fixing elements 6 at the left-hand, the right-hand, the upper and the lower side of the substrate holder according to the invention. Also located in the centre is a large zone 7'', which in particular comprises only one single fixing element 6.

Figure 5:
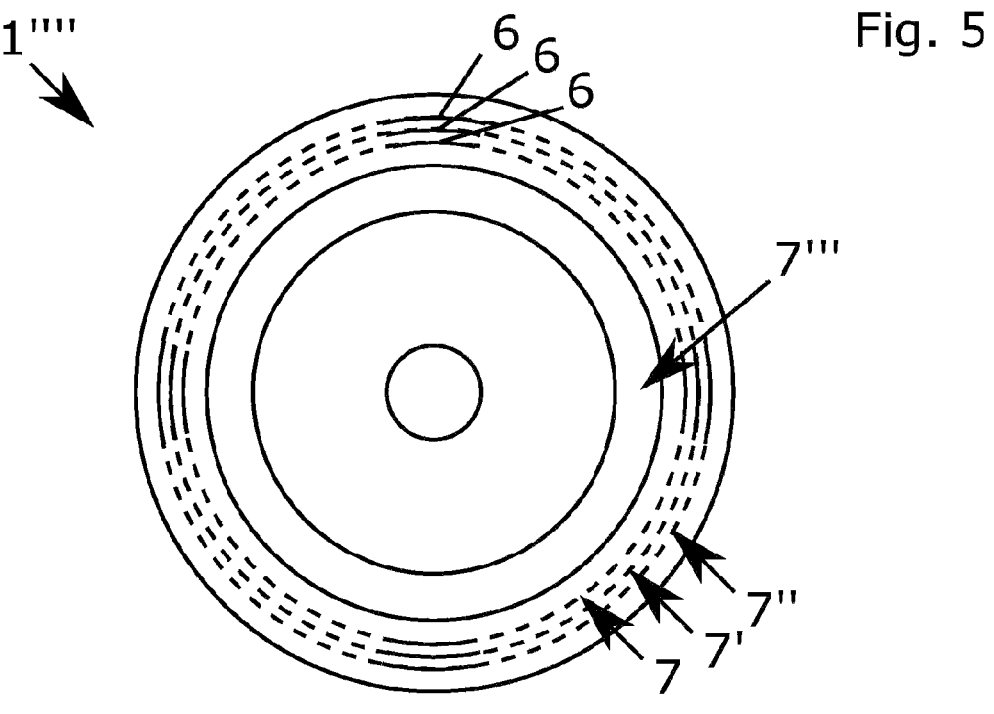
FIG. 5 shows a substrate holder according to the invention represented in a simplified form in a fifth embodiment according to the invention.

FIG. 5 shows a further, special embodiment of a substrate holder according to the invention, wherein there are four different zones 7, 7', 7'', 7'''. The first, outermost zone is comprised of four fixing elements 6, which are positioned along a circle. The same applies equally to zones 7' and 7'', which are located at a smaller radius in each case. Fourth zone 7''' is a larger zone with a still smaller radius, which is closed in particular around the whole circumference, and in particular comprises only one fixing element 6.

Figure 6:
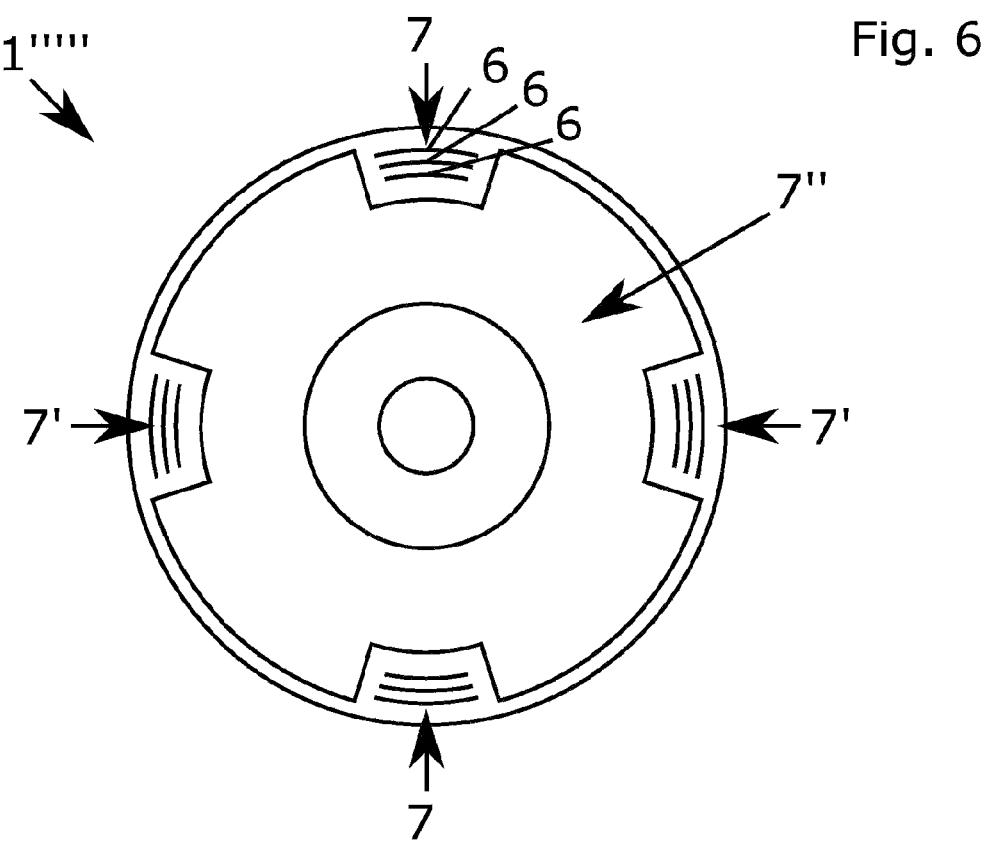
FIG. 6 shows a substrate holder according to the invention represented in a simplified form in a sixth embodiment according to the invention and FIG. 7 shows a substrate holder according to the invention represented in a simplified form according to FIG. 4 with a fixed substrate.

FIG. 6 shows a further, special embodiment of a substrate holder according to the invention, wherein there are three different zones 7, 7', 7''. First zone 7 is comprised of six fixing elements 6. Fixing elements 6 are located in two groups each with three fixing elements at the upper and lower position. Second zone 7' is comprised of six fixing elements 6. Fixing elements 6 are located in two groups each with three fixing elements at the left-hand and right-hand position. A further large-area zone 7'' comprising in particular of only one fixing element 6 fills a large part of the remaining area and even partially surrounds the two zones 7, 7'.

The concept should emerge from the figures shown that any number of fixing elements 6 can be joined together to form arbitrary zones. It will be explained in the further figures why this zone formation is necessary.

Figure 7:
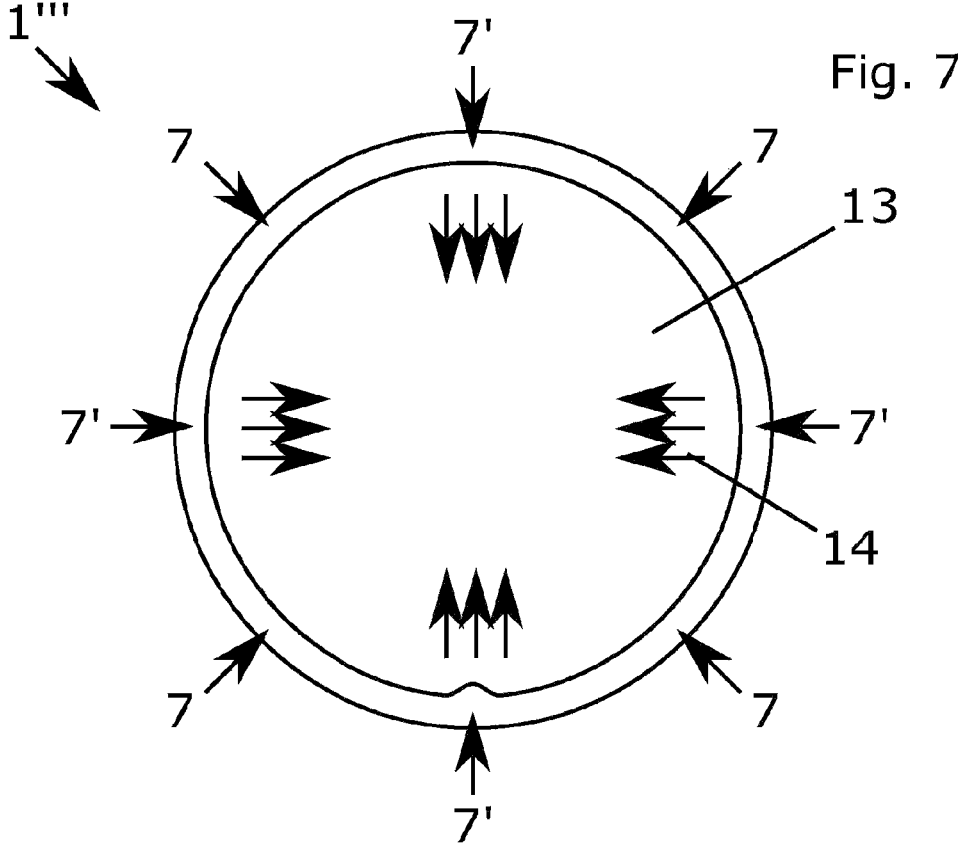

FIG. 7 shows by way of example substrate holder 1''' according to the invention from FIG. 4. Substrate holder 1''' does in fact fix a substrate 13 which covers fixing elements 6. The position of zones 7, 7' is nonetheless shown. Arrows 14 symbolise a mechanical anisotropy, which is to be compensated for with the aid of zones 7, 7', 7'' according to the invention and, to be precise, before and/or during the bonding process. Represented substrate 13 could for example have an E-modulus dependent on the direction, such as is the case for cubic materials inside the crystallographic (100) plane. A force such as gravity in itself engaging homogeneously, which leads to sagging of substrate 13, would thus lead to an anisotropic expansion inside the substrate. It would also be conceivable that, due to a fixing of the substrate exclusively by zone 7', a distortion arises which would then also be referred to as a mechanical anisotropy. This would perhaps be able to be compensated for by the additional switching of zone 7'' (covered by substrate 13). The correct switching of the individual zones for the optimum and desired compensation of mechanical anisotropy 14 is ideally determined by tests. It is also mentioned that individual fixing elements 6 of a zone can in particular be designed such that they are arranged radially. In particular, this arrangement permits a radial adaptation, while the bonding wave is moving from the centre to the edge.

LIST OF REFERENCE NUMBERS

1,1',1'',1''',1'''',1''''' substrate holder
2 base body
3 fastenings
4 cutout
5 deformation element
6, 6', 6'' fixing element
7, 7' zone
8 sensor
9 pin
10 web
11 depression
12 fluid outlet, in particular drill hole
13 substrate
14 mechanical anisotropy

What is claimed is:

1. A substrate holder for mounting a substrate, comprising:
   fixing elements configured to fix the substrate and adapt a propagation speed and a form of a bonding wave during bonding to minimize run-out error during the bonding, the fixing elements being grouped into a plurality of zones, the zones being arranged circular ring-shaped and exclusively in a periphery of the substrate holder, the zones being separated azimuthally from each other; and
   a plurality of sensors configured to measure the propagation speed and the form of the bonding wave during bonding to enable the fixing elements to adapt the propagation speed and the form of the bonding wave during the bonding, the sensors being positioned along a plurality of radii running through the zones.

2. The substrate holder according to claim 1, wherein the zones are arranged symmetrically relative to a centre of the substrate holder.

3. The substrate holder according to claim 1, wherein the zones are arranged in a plurality of rings around a centre of the substrate holder.

4. The substrate holder according to claim 3, wherein the rings are circular rings.

5. The substrate holder according to claim 1, wherein the zones are uniformly spaced apart from one another in either an azimuthal direction or a radial direction and the azimuthal direction.

6. The substrate holder according to claim 1, wherein the zones are formed with a changing width, with an increasing width, from a centre of the substrate holder to an edge of the substrate holder.

7. The substrate holder according to claim 1, wherein the zones are individually switchable such that all of the fixing elements grouped in a respective zone are switched to a fixing state or a non-fixing state.

8. The substrate holder according to claim 1, wherein a number of the zones are grouped and switched in common such that all of the fixing elements of the grouped zones are switched to a fixing state or a non-fixing state.

9. The substrate holder according to claim 1, wherein a number of the fixing elements in the zones are flexibly changeable.

10. The substrate holder according to claim 1, wherein the fixing elements are flexibly assignable to different zones.

11. The substrate holder according to claim 1, wherein the fixing elements can be triggered in a cross-zonal manner.

12. The substrate holder according to claim 1, wherein the radii run through centres of the zones.

13. The substrate holder according to claim 12, wherein the sensors are first sensors and the radii are first radii, and
   wherein second sensors are positioned along a plurality of second radii running through the zones and lying between the first radii running through the centres of the zones, the second sensors being configured to measure the propagation speed in a direction other than that which is measured by the first sensors.

14. A method for fixing and bonding the substrate or a plurality of the substrates with the substrate holder according to claim 1.

15. The method according to claim 14, wherein the zones are individually switchable such that all of the fixing elements grouped in a respective zone are switched to a fixing state or a non-fixing state.

16. The method according to claim 14, wherein the zones are grouped and switched in common such that all of the fixing elements of the grouped zones are switched to a fixing state or a non-fixing state.

17. The method according to claim 14, wherein a number of the fixing elements in the zones are flexibly changeable.

18. The method according to claim 14, wherein the fixing elements are flexibly assignable to different zones.

* * * * *